United States Patent
Song

(10) Patent No.: US 9,843,325 B2
(45) Date of Patent: Dec. 12, 2017

(54) LEVEL SHIFTER AND PARALLEL-TO-SERIAL CONVERTER INCLUDING THE SAME

(71) Applicant: SK hynix Inc., Gyeonggi-do (KR)

(72) Inventor: Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/378,847

(22) Filed: Dec. 14, 2016

(65) Prior Publication Data
US 2017/0149435 A1    May 25, 2017

Related U.S. Application Data

(62) Division of application No. 15/001,904, filed on Jan. 20, 2016, now Pat. No. 9,553,585.

(30) Foreign Application Priority Data

Aug. 3, 2015  (KR) .......................... 10-2015-0109459

(51) Int. Cl.
*H03M 9/00* (2006.01)
*H03K 19/0185* (2006.01)

(52) U.S. Cl.
CPC ...... *H03K 19/018528* (2013.01); *H03M 9/00* (2013.01)

(58) Field of Classification Search
CPC .................... H03K 19/018528; H03M 9/00
USPC ........................................ 341/101; 327/333
See application file for complete search history.

(56) References Cited

U.S. PATENT DOCUMENTS

| | | | |
|---|---|---|---|
| 2004/0113669 A1* | 6/2004 | Wodnicki | H03K 17/163 327/170 |
| 2008/0049540 A1* | 2/2008 | Jeong | G11C 7/1048 365/233.1 |
| 2011/0050680 A1* | 3/2011 | Chung | G09G 3/3688 345/214 |
| 2012/0170698 A1* | 7/2012 | Jinagar | H03L 7/00 375/359 |
| 2015/0256135 A1* | 9/2015 | Coimbra | H03F 3/3016 330/253 |

\* cited by examiner

*Primary Examiner* — Peguy Jean Pierre
(74) *Attorney, Agent, or Firm* — IP & T Group LLP

(57) ABSTRACT

A level shifter circuit includes a level shifting unit configured to receive signals that may vary in a first range via a positive input terminal and a negative input terminal, respectively and to output signals that may vary in a second range to a positive output terminal and a negative output terminal, respectively, where the second range is larger than the first range, a first pre-charging unit configured to pre-charge the positive output terminal to a predetermined level when a clock is in a first level, and a second pre-charging unit configured to pre-charge the negative output terminal to the predetermined level when the clock is in the first level.

3 Claims, 2 Drawing Sheets

LEVEL SHIFTER AND PARALLEL-TO-SERIAL CONVERTER INCLUDING THE SAME

CROSS-REFERENCE TO RELATED APPLICATIONS

This application is a division of U.S. patent application Ser. No. 15/001,094 filed on Jan. 20, 2016, which claims priority of Korean Patent Application No. 10-2015-0109459, filed on Aug. 3, 2015. The disclosure of each of the foregoing application is incorporated herein by reference in its entirety.

BACKGROUND

1. Field

Various embodiments of the present disclosure relate to a level shifter and a parallel-to-serial converter including the same.

2. Description of the Related Art

Many electronic circuits having various functions may be integrated in a single integrated circuit. Often, the various electronic circuits may operate at different voltages, in which case, an interface circuit may be required to shift the voltage levels of signals transmitted between the circuits. Such an interface circuit is generally referred to as a level shifter circuit or a level shifter.

FIG. 1 is a circuit diagram illustrating a conventional level shifter.

Referring to FIG. 1, a conventional level shifter may be configured to receive signals that may vary between a ground voltage level and a first power source voltage level VDD1 through an input terminal IN and a complementary input terminal INB, to generate signals that may vary between the ground voltage level and VDD2 (a second power source voltage having a level higher than that of VDD1) level, and to output the generated signals to an output terminal OUT and a complementary output terminal OUTB.

In a conventional level shifter, an error may be generated when the input signals to the input terminals IN and INB are transient. For example, when a signal inputted to the input terminal IN is transitioning from a ground voltage level to a VDD1 level, a fighting may occur between the P-type metal-oxide-semiconductor (PMOS) transistor 101, which is already turned on, and the N-type metal-oxide-semiconductor (NMOS) transistor 103. If the NMOS transistor 103 may be sufficiently turned on, the voltage level of the complementary output terminal OUTB may be decreased, while a voltage level of the output terminal OUT may be increased, causing the PMOS transistor 102 to turn on and the PMOS transistor 101 to turn off, so that eventually the fighting between the PMOS transistor 101 and the NMOS transistor 103 may be settled. However, when the difference of the voltage levels of VDD1 and VDD2 is large, the NMOS transistor 103 may not be turned on sufficiently, generating an error wherein the fighting phenomenon between the two transistors may continue for a substantial amount of time negatively impacting the operation of the level shifter.

SUMMARY

The present disclosure has been achieved in view of the above aspects, and it is an object of the present disclosure to improve operation stability of a level shifter and to provide a parallel-to-serial converter configured to perform both a level shifting operation and a parallel-to-serial converting operation.

A level shifter according to an embodiment of the present invention may include a level shifting unit configured to receive signals that may vary in a first may vary range via a positive input terminal and a negative input terminal, respectively, and to output signals that may vary in a second may vary range to a positive output terminal and a negative output terminal, respectively, where the second may vary range is larger than the first may vary range, a first pre-charging unit configured to pre-charge the positive output terminal to a predetermined level when a clock is in a first level, and a second pre-charging unit configured to pre-charge the negative output terminal to the predetermined level when the clock is in the first level.

Further, the level shifting unit is configured to operate when the clock is in a second level, and the clock is configured to may vary in the first may vary range.

Moreover, the first pre-charging unit may include a first inverter configured to invert a signal from the positive output terminal, a first PMOS transistor configured to transfer an output of the first inverter to a first node when the clock is in the second level, a first NMOS transistor configured to drive the first node to a ground voltage level when the clock is in the first level, a second PMOS transistor configured to supply a voltage of the predetermined level when the clock is in the first level, and a third PMOS transistor configured to transfer the voltage of the predetermined level supplied from the second PMOS transistor to the positive output terminal under a control of the first node.

Further, the second pre-charging unit may include a second inverter configured to invert a signal from the negative output terminal, a fourth PMOS transistor configured to transfer an output of the second inverter to a second node when the clock is in the second level, a second NMOS transistor configured to drive the second node to the ground voltage level when the clock is in the first level, a fifth PMOS transistor configured to supply the voltage of the predetermined level when the clock is in the first level, and a sixth PMOS transistor configured to transfer the voltage of the predetermined level supplied from the fifth PMOS transistor to the negative output terminal under a control of the second node.

Moreover, the level shifting unit may include a third NMOS transistor configured to sink a current from a common source node in response to the clock, a fourth NMOS transistor configured to sink a current from the negative output terminal to the common source node in response to a voltage level of the positive input terminal, a fifth NMOS transistor configured to sink a current from the positive output terminal to the common source node in response to a voltage level of the negative input terminal, a seventh PMOS transistor configured to drive the positive output terminal with a high power source voltage in response to a voltage level of the negative output terminal, and an eighth PMOS transistor configured to drive the negative output terminal with the high power source voltage in response to a voltage level of the positive output terminal.

Further, the level shifter further may include a transferring unit configured to transfer the signals from the positive output terminal and the negative output terminal to a line output of the level shifter when the clock is in the second level.

A parallel-to-serial converter according to an embodiment of the present invention may include a first level shifter configured to be activated when a clock is in a first level, to shift a level of a first input signal that may vary within a first range to generate a first output signal that may vary within a second range, where the range may be larger than the first range, and to transfer the first output signal to a line output, and a second level shifter configured to be activated when the clock is in a second level, to shift a level of a second input signal that may vary within the first range to generate a second output signal that may vary within the second range, and to transfer the second output signal to the line output.

Further, the first level shifter may include a first level shifting unit configured to receive the first input signal and an inverted first input signal via a first positive input terminal and a first negative input terminal, respectively, and to output signals that may vary within the second range to a first positive output terminal and a first negative output terminal, respectively, a first pre-charging unit configured to pre-charge the first positive output terminal to a predetermined level when the clock is in the second level, a second pre-charging unit configured to pre-charge the first negative output terminal to the predetermined level when the clock is in the second level, and a first transferring unit configured to transfer the signals from the first positive output terminal and the first negative output terminal to the line output when the clock is in the first level.

Moreover, the second level shifter may include a second level shifting unit configured to receive the second input signal and an inverted second input signal via a second positive input terminal and a second negative input terminal, respectively, and to output signals that may vary within the second range to a second positive output terminal and a second negative output terminal, respectively, a third pre-charging unit configured to pre-charge the second positive output terminal to the predetermined level when the clock is in the first level, a fourth pre-charging unit configured to pre-charge the second negative output terminal to the predetermined level when the clock is in the first level, and a second transferring unit configured to transfer the signals from the second positive output terminal and the second negative output terminal to the line output when the clock is in the second level.

Further, the first level shifting unit is configured to operate when the clock is in the first level, the second level shifting unit is configured to operate when the clock is in the second level, and the clock is configured to vary within the first range.

According to an embodiment of the present invention, a level shifter having improved operational stability improved and a parallel-to-serial converter configured to perform both a level shifting operation and a parallel-to-serial converting operation may be provided.

DETAILED DESCRIPTION

Figure 1:
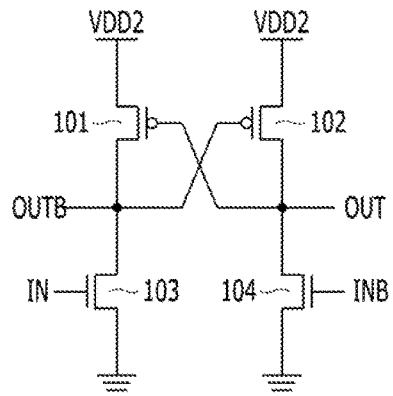
FIG. 1 is a circuit diagram illustrating a conventional level shifter.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component.

Figure 2:
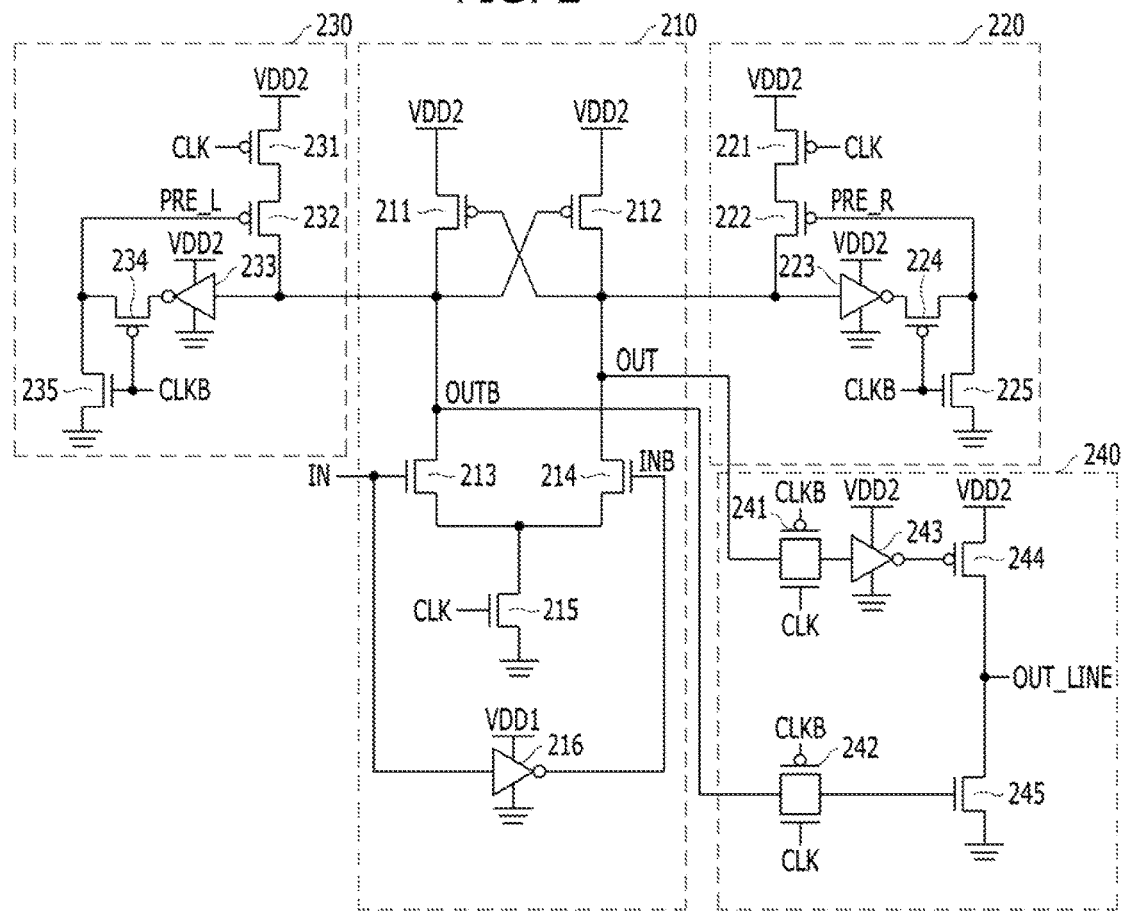
FIG. 2 is a circuit diagram illustrating a level shifter, according to an embodiment of the present invention.

Referring to FIG. 2 a level shifter according to an embodiment of the present invention is provided. The level shifter may include a level shifting unit 210, a first pre-charging unit 220, a second pre-charging unit 230, and a transferring unit 240.

The level shifting unit 210 may shift the voltage levels of signals inputted to an input terminal IN and a complementary input terminal INB. The level shifting unit 210 may also output the level-shifted signals to an output terminal OUT and a complementary output terminal OUTB. The signals to the input terminal IN and the complementary input terminal INB may vary between a ground voltage level and VDD1 (first power source voltage) level. Signals outputted to the output terminal OUT and the complementary output terminal OUTB may vary between the ground voltage level and VDD2 (VDD2>VDD1) level. For example, the level shifting unit 210 may receive signals having a small difference in their amplitude and generate signals having a large difference in their amplitude. The level shifting unit 210 may be enabled (i.e., activated to operate) when a clock CLK is in a "High" logic level. Further, the clock CLK may vary between the ground voltage level and the VDD1 level.

The level shifting unit 210 may include an NMOS transistor 215 that may sink a current from a common source node CS in response to the clock CLK, an NMOS transistor 213 that may discharge the complementary output terminal OUTB in response to a voltage level of the input terminal IN, an NMOS transistor 214 that may discharge the output terminal OUT in response to a voltage level of the complementary input terminal INB, a PMOS transistor 212 that may drive the output terminal OUT with the second power source voltage VDD2 in response to a voltage level of the complementary output terminal OUTB, and a PMOS transistor 211 that may drive the complementary output terminal OUTB with the second power source voltage VDD2 in response to a voltage level of the output terminal OUT.

The first pre-charging unit 220 may pre-charge the output terminal OUT to a predetermined level when the clock CLK is in a "Low" logic level. The predetermined level may be the level of the second power source voltage VDD2. As the output terminal OUT is pre-charged to the level of the second power source voltage VDD2 by the first pre-charging unit 220 during a period where the clock CLK is in a "Low" logic level, i.e., the level shifting unit 210 is disabled, the fighting phenomenon between the PMOS transistor 211 and the NMOS transistor 213 may be prevented via operation of the level shifting unit 210.

The first pre-charging unit 220 may include an inverter 223 that may invert the signal from the output terminal OUT, a PMOS transistor 224 that may transfer an output of the inverter 223 to a first node PRE_R when the clock CLK is in a "High" logic level (i.e., an inverted clock CLKB is in a "Low" logic level), an NMOS transistor 225 that may drive the first node PRE_R to a ground voltage level when the clock CLK is in a "Low" logic level (i.e., the inverted clock CLKB is in a "High" logic level), a PMOS transistor 221 that may supply the second power source voltage VDD2 when the clock CLK is "Low", and a PMOS transistor 222 that may transfer the second power source voltage VDD2 supplied through the PMOS transistor 221 to the output terminal OUT under a control of the first node PRE_R. When the clock CLK is "Low", the PMOS transistor 221 and the NMOS transistor 225 may be turned on, the PMOS transistor 222 is turned on by the NMOS transistor 225 for example in the ON state, and then the output terminal OUT may be pre-charged to the level of the second power source voltage VDD2. When the clock CLK is "High", the PMOS transistor 221 is turned off; however, as the clock CLK rises up to the level of the first power source voltage VDD1, the PMOS transistor 221 may not be completely turned off. However, when the clock CLK is "High" and the output terminal OUT is "Low", i.e., during a period where the output terminal OUT should not be pre-charged, the voltage level of the output terminal OUT may exert an influence on the first node PRE_R via the inverter 223 and the PMOS transistor 224, and the PMOS transistor 222 may be completely turned off by the first node PRE_R. Therefore, a leakage current due to an incomplete OFF state of the PMOS transistor 221 may be prevented from being generated.

The second pre-charging unit 230 pre-charges the complementary output terminal OUTB to a predetermined level when the clock CLK is "Low". The predetermined level may be the level of the second power source voltage VDD2. During a period where the clock CLK is "Low" by the second pre-charging unit 230, i.e., the level shifting unit 210 is disabled, the complementary output terminal OUTB may be pre-charged to the level of the second power source voltage VDD2, and hence the fighting phenomenon between the PMOS transistor 212 and the NMOS transistor 214 may be prevented when the level shifting unit 210 operates.

The second pre-charging unit 230 may include an inverter 233 that may invert the signal from the complementary output terminal OUTB, a PMOS transistor 234 that may transfer an output of the inverter 233 to a second node PRE_L when the clock CLK is "High" (i.e., the inverted clock CLKB is "Low"), an NMOS transistor 235 that may drive the second node PRE_L to the ground voltage level when the clock CLK is "Low" (i.e., the inverted clock CLKB is "High"), a PMOS transistor 231 that may supply the second power source voltage VDD2 when the clock CLK is "Low", and a PMOS transistor 232 that may transfer the second power source voltage VDD2 supplied through the PMOS transistor 231 to the complementary output terminal OUTB under a control of the second node PRE_L. When the clock CLK is "Low", the PMOS transistor 231 and the NMOS transistor 235 may be turned on, the PMOS transistor 232 is turned on by the NMOS transistor 235 for example in the ON state, and then the complementary output terminal OUTB may be pre-charged to the level of the second power source voltage VDD2. When the clock CLK is "High", the PMOS transistor 231 is turned off; however, as the clock CLK rises up to the level of the first power source voltage VDD1, the PMOS transistor 231 may not be completely turned off. However, when the clock CLK is "High" and the complementary output terminal OUTB is "Low", i.e., during a period where the complementary output terminal OUTB should not be pre-charged, the voltage level of the complementary output terminal OUTB may exert an influence on the second node PRE_L via the inverter 233 and the PMOS transistor 234, and the PMOS transistor 232 may be completely turned off by the second node PRE_L. Therefore, a leakage current due to an incomplete OFF state of the PMOS transistor 231 may be prevented from being generated.

The transferring unit 240 may transfer the signals from the output terminal OUT and the complementary output terminal OUTB to an output line OUT_LINE of the level shifter when the clock CLK is "High", i.e., during a period where the level shifting unit 210 operates. The transferring unit 240 may include pass gates 241 and 242 that may be turned on during a period where the clock CLK is "High", an inverter 243 that may invert the signal from the output terminal OUT, a PMOS transistor 244 for example driven by an output of the inverter 243, and an NMOS transistor 245 that is driven by the signal from the complementary output terminal OUTB.

In the level shifter shown in FIG. 2, the fighting phenomenon generated at the level shifting unit 210 may be prevented. Moreover, the current leakage generated at the first pre-charging unit 220 and the second pre-charging unit 230 that respectively pre-charges the output terminal OUT and the complementary output terminal OUTB may also be prevented by pre-charging the output terminal OUT and the complementary output terminal OUTB during a period when the level shifting unit 210 does not operate.

Figure 3:
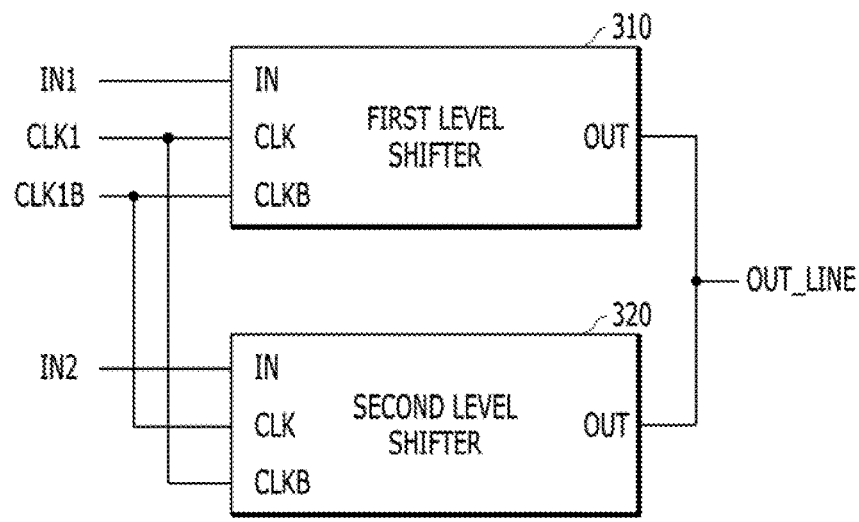
FIG. 3 is a block diagram illustrating a parallel-to-serial converter, according to an embodiment of the present invention.

FIG. 3 is a block diagram illustrating a parallel-to-serial converter according to an embodiment of the present invention.

Referring to FIG. 3, the parallel-to-serial converter may include a first level shifter 310 and a second level shifter 320.

Each of the first level shifter 310 and the second level shifter 320 may be configured in the same manner as the level shifter shown in FIG. 2. A first input signal IN1 may be inputted to an input terminal IN of the first level shifter 310. A second input signal IN2 may be inputted to an input terminal IN of the second level shifter 320. Clocks having opposite phases may be inputted to the first and second level shifters 310, 320, respectively. For example, a clock CLK1 may be inputted to a clock terminal CLK of the first level shifter 310, while a complementary clock CLK1B may be inputted to a clock terminal CLK of the second level shifter 320. Moreover, the complementary clock CLK1B may be inputted to a complementary clock terminal CLKB of the first level shifter 310, and the clock CLK1 may be inputted to a complementary clock terminal CLKB of the second level shifter 320.

In the example shown in FIG. 3, the first and second level shifters 310, 320 may share an output line OUT_LINE.

During a period where the clock CLK1 is "High", the first level shifter 310 may shift the level of the first input signal IN1 and transfer the level-shifted signal to the output line OUT_LINE pre-charging the second level shifter 320.

During a period where the clock CLK1 is "Low", the second level shifter 320 may shift the level of the second input signal IN2 and transfer the level-shifted signal to the output line OUT_LINE, pre-charging the first level shifter 310. Eventually, the first and second input signals IN1, IN2, which are in parallel configuration, may be level-shifted, parallel-to-serial converted, and outputted to the output line OUT_LINE. For example, the first and second level shifters 310 and 320 may be alternately enabled based on the clock CLK1.

Figure 4:
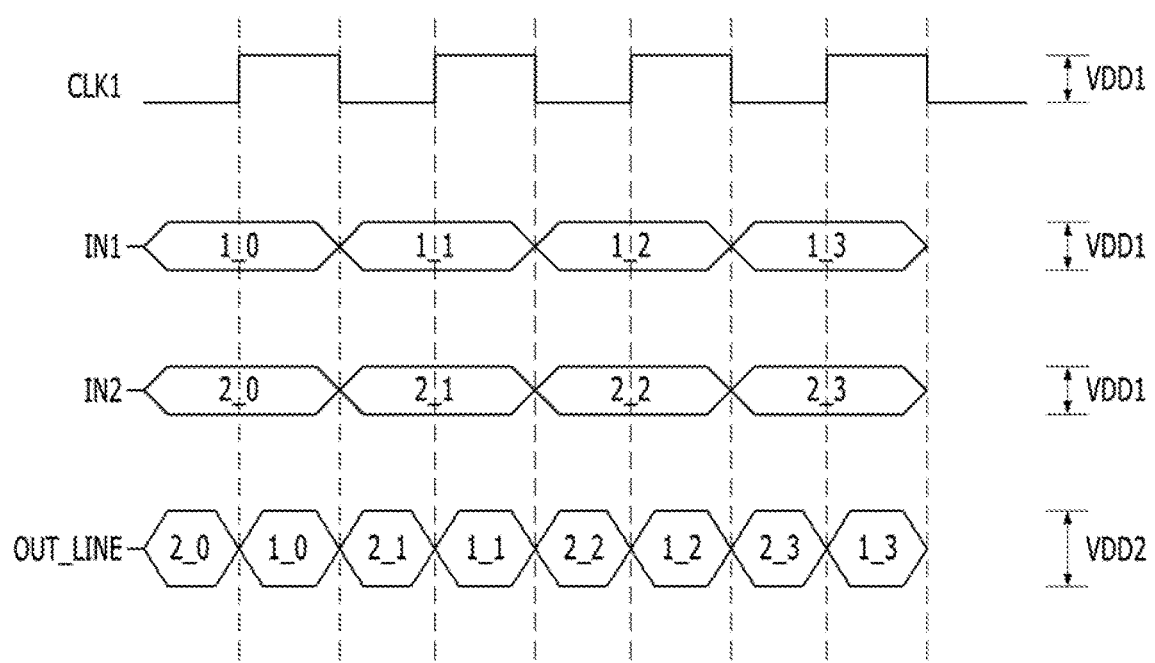
FIG. 4 is a timing diagram for describing an operation of the parallel-to-serial converter shown in FIG. 3.

Referring now to FIG. 4 the first input signal IN1 and the second input signal IN2 that vary between the ground voltage and the first power source voltage VDD1 are level-shifted to vary between the ground and the second power source voltage VDD2, parallel-to-serial converted, and outputted to the output line OUT_LINE.

Although various embodiments have been described for illustrative purposes, it will be apparent to those skilled in the art that various changes and modifications may be made without departing from the spirit and scope of the invention as defined in the following claims.

What is claimed is:

1. A parallel-to-serial converter, comprising:
    a first level shifter suitable for shifting a level of a first input signal having a first amplitude to output first output signals having a second amplitude, to an output line; and
    a second level shifter suitable for shifting a level of a second input signal having the first amplitude to output second output signals having the second amplitude to the output line,
    wherein the first and level shifters are alternately enabled based on a clock, and
    wherein the first level shifter includes,
        a first level shifting unit suitable for receiving the first input signal to generate the first output signals through a first output terminal and a first complementary output terminal, when the clock is in a first level;
        a first pre-charging unit suitable for pre-charging the first output terminal by a pre-charging voltage having a predetermined level when the clock is in a second level,
        a second pre-charging unit suitable for pre-charging the first complementary output terminal by the pre-charging voltage when the clock is in the second level, and
        a first transferring unit suitable for transferring the first output signals from the first output terminal and the first complementary output terminal to the output line when the clock is in the first level.

2. The parallel-to-serial converter according to claim 1, wherein the second level shifter includes,
    a second level shifting unit suitable for receiving the second input signal to generate the second output signals through a second output terminal and a second complementary output terminal, when the clock is in the second level;
    a third pre-charging unit suitable for pre-charging the second output terminal by the pre-charging voltage when the clock is in the first level,
    a fourth pre-charging unit suitable for pre-charging the second complementary output terminal by the pre-charging voltage when the clock is in the first level, and
    a second transferring unit suitable for transferring the second output signals from the second output terminal and the second complementary output terminal to the output line when the clock is in the second level.

3. The parallel-to-serial converter according to claim 1, wherein the clock has the first amplitude.

* * * * *